US006927529B2

(12) United States Patent
Fong et al.

(10) Patent No.: US 6,927,529 B2
(45) Date of Patent: Aug. 9, 2005

(54) SOLID SLUG LONGITUDINAL PIEZOELECTRIC LATCHING RELAY

(75) Inventors: Arthur Fong, Colorado Springs, CO (US); Marvin Glenn Wong, Woodland Park, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/137,692

(22) Filed: May 2, 2002

(65) Prior Publication Data

US 2003/0207102 A1 Nov. 6, 2003

(51) Int. Cl.[7] .......................... H01L 41/08; H01H 51/22
(52) U.S. Cl. ........................ 310/328; 310/363; 200/181
(58) Field of Search ................................ 310/328, 363, 310/365; 200/181

(56) References Cited

U.S. PATENT DOCUMENTS

| | | | | |
|---|---|---|---|---|
| 2,312,672 A | | 5/1943 | Pollard, Jr. | |
| 2,564,081 A | | 8/1951 | Schilling | |
| 3,430,020 A | * | 2/1969 | Von Tomkewitsch et al. | 200/181 |
| 3,529,268 A | | 9/1970 | Rauterberg | |
| 3,600,537 A | | 8/1971 | Twyford | |
| 3,639,165 A | | 2/1972 | Rairden, III | |
| 3,657,647 A | | 4/1972 | Bausman et al. | |
| 4,103,135 A | | 7/1978 | Gomez et al. | |
| 4,200,779 A | * | 4/1980 | Zakurdaev et al. | 200/187 |
| 4,238,748 A | | 12/1980 | Goullin et al. | |
| 4,245,886 A | | 1/1981 | Kolodzey et al. | |
| 4,336,570 A | | 6/1982 | Brower et al. | |
| 4,419,650 A | | 12/1983 | John | |
| 4,434,337 A | | 2/1984 | Becker | |
| 4,475,033 A | | 10/1984 | Willemsen et al. | |
| 4,505,539 A | | 3/1985 | Auracher et al. | |

(Continued)

FOREIGN PATENT DOCUMENTS

| | | |
|---|---|---|
| EP | 0593836 A1 | 4/1994 |
| FR | 2418539 | 9/1979 |
| FR | 2458138 | 12/1980 |
| FR | 2667396 | 4/1992 |
| JP | SHO 36-18575 | 10/1961 |
| JP | 62-276838 | 12/1987 |
| JP | 63-294317 | 12/1988 |
| JP | 8-125487 | 5/1996 |
| JP | 9-161640 | 6/1997 |
| WO | WO99/46624 | 12/1999 |

OTHER PUBLICATIONS

Joonwon Kim et al., "A Micromechanical Switch With Electrostatically Driven Liquid–Metal Droplet", 4 pages, no date given.

(Continued)

*Primary Examiner*—Thomas M. Dougherty

(57) ABSTRACT

In accordance with the invention, a piezoelectrically actuated relay that switches and latches by means of a solid slug and liquid metal is disclosed. The relay operates by means of a longitudinal displacement of a piezoelectric element in extension mode displacing a liquid metal drop and causing it to wet between at least one contact pad on the piezoelectric element or substrate and at least one other fixed pad to close the switch contact. This motion of the piezoelectric element is rapid and causes the imparted momentum of the solid slug and liquid metal drop to overcome the surface tension forces that would hold the bulk of the liquid metal drop in contact with the contact pad or pads near the actuating piezoelectric element. The switch latches by means of surface tension and the liquid metal wetting to the contact pads.

15 Claims, 3 Drawing Sheets

U.S. PATENT DOCUMENTS

| | | | | | |
|---|---|---|---|---|---|
| 4,582,391 | A | | 4/1986 | Legrand | |
| 4,628,161 | A | | 12/1986 | Thackrey | |
| 4,652,710 | A | | 3/1987 | Karnowsky et al. | |
| 4,657,339 | A | | 4/1987 | Fick | |
| 4,742,263 | A | | 5/1988 | Harnden, Jr. et al. | |
| 4,786,130 | A | | 11/1988 | Georgiou et al. | |
| 4,797,519 | A | | 1/1989 | Elenbaas | |
| 4,804,932 | A | | 2/1989 | Akanuma et al. | |
| 4,988,157 | A | | 1/1991 | Jackel et al. | |
| 5,278,012 | A | | 1/1994 | Yamanaka et al. | |
| 5,415,026 | A | | 5/1995 | Ford | |
| 5,502,781 | A | | 3/1996 | Li et al. | |
| 5,644,676 | A | | 7/1997 | Blomberg et al. | |
| 5,675,310 | A | | 10/1997 | Wojnarowski et al. | |
| 5,677,823 | A | | 10/1997 | Smith | |
| 5,751,074 | A | | 5/1998 | Prior et al. | |
| 5,751,552 | A | | 5/1998 | Scanlan et al. | |
| 5,828,799 | A | | 10/1998 | Donald | |
| 5,841,686 | A | | 11/1998 | Chu et al. | |
| 5,849,623 | A | | 12/1998 | Wojnarowski et al. | |
| 5,874,770 | A | | 2/1999 | Saia et al. | |
| 5,875,531 | A | | 3/1999 | Nellissen et al. | |
| 5,886,407 | A | | 3/1999 | Polese et al. | |
| 5,889,325 | A | | 3/1999 | Uchida et al. | |
| 5,912,606 | A | | 6/1999 | Nathanson et al. | |
| 5,915,050 | A | | 6/1999 | Russell et al. | |
| 5,972,737 | A | | 10/1999 | Polese et al. | |
| 5,994,750 | A | | 11/1999 | Yahi | |
| 6,021,048 | A | | 2/2000 | Smith | |
| 6,180,873 | B1 | | 1/2001 | Bitko | |
| 6,201,682 | B1 | | 3/2001 | Mooij et al. | |
| 6,207,234 | B1 | | 3/2001 | Jiang | |
| 6,212,308 | B1 | | 4/2001 | Donald | |
| 6,225,133 | B1 | | 5/2001 | Yamamichi et al. | |
| 6,278,541 | B1 | | 8/2001 | Baker | |
| 6,304,450 | B1 | | 10/2001 | Dibene, II et al. | |
| 6,320,994 | B1 | | 11/2001 | Donald | |
| 6,323,447 | B1 | | 11/2001 | Kondoh et al. | 200/182 |
| 6,351,579 | B1 | | 2/2002 | Early et al. | |
| 6,356,679 | B1 | | 3/2002 | Kapany | |
| 6,373,356 | B1 | | 4/2002 | Gutierrez et al. | 335/47 |
| 6,396,012 | B1 | | 5/2002 | Bloomfield | |
| 6,396,371 | B2 | * | 5/2002 | Streeter et al. | 335/78 |
| 6,408,112 | B1 | | 6/2002 | Bartels | |
| 6,446,317 | B1 | | 9/2002 | Figueroa et al. | |
| 6,453,086 | B1 | | 9/2002 | Tarazona | |
| 6,470,106 | B2 | | 10/2002 | McClelland et al. | |
| 6,487,333 | B2 | | 11/2002 | Fouquet et al. | |
| 6,501,354 | B1 | | 12/2002 | Gutierrez et al. | |
| 6,512,322 | B1 | * | 1/2003 | Fong et al. | 310/328 |
| 6,515,404 | B1 | * | 2/2003 | Wong | 310/328 |
| 6,516,504 | B2 | | 2/2003 | Schaper | |
| 6,559,420 | B1 | | 5/2003 | Zarev | |
| 6,633,213 | B1 | | 10/2003 | Dove | |
| 2002/0037128 | A1 | | 3/2002 | Burger et al. | |
| 2002/0146197 | A1 | | 10/2002 | Yong | |
| 2002/0150323 | A1 | | 10/2002 | Nishida et al. | |
| 2002/0168133 | A1 | | 11/2002 | Saito | |
| 2003/0035611 | A1 | | 2/2003 | Shi | |

OTHER PUBLICATIONS

Marvin Glenn Wong, "Laser Cut Channel Plate For a Switch", Patent application (U.S. Appl. No. 10/317,932 filed Dec. 12, 2002), 11 pages of specifications, 5 pages of claims, 1 page of abstract, and 4 sheets of formal drawings (Fig. 1–10).

Marvin Glenn Wong, "A Piezoelectricaly Actuated Liquid Metal Switch", May 2, 2002, patent application (pending), 12 pages of specification, 5 pages of claims, 1 page of abstract, and 10 sheets of drawings (Fig. 1–10).

TDB–ACC–No: NB406827, "Integral Power Resistors For Aluminum Substrate", IBM Technical Disclosure Bulletin, Jun. 1984, US, vol. 27, Issue No. 1B, p 827.

* cited by examiner

SOLID SLUG LONGITUDINAL PIEZOELECTRIC LATCHING RELAY

BACKGROUND

Piezoelectric materials and magnetostrictive materials (collectively referred to below as "piezoelectric materials") deform when an electric field or magnetic field is applied. Thus piezoelectric materials, when used as an actuator, are capable or controlling the relative position of two surfaces.

Piezoelectricity is the general term to describe the property exhibited by certain crystals of becoming electrically polarized when stress is applied to them. Quartz is a good example of a piezoelectric crystal. If stress is applied to such a crystal, it will develop an electric moment proportional to the applied stress.

This is the direct piezoelectric effect. Conversely, if it is placed on an electric field, a piezoelectric crystal changes its shape slightly. This is the inverse piezoelectric effect.

One of the most used piezoelectric materials is the aforementioned quartz. Piezoelectricity is also exhibited by ferroelectric crystals, e.g. tourmaline and Rochelle salt. These already have a spontaneous polarization, and the piezoelectric effect shows up in them as a change in this polarization. Other piezoelectric materials include certain ceramic materials and certain polymer materials. Since they are capable of controlling the relative position of two surfaces, piezoelectric materials have been used in the past as valve actuators and positional controls for microscopes. Piezoelectric materials, especially those of the ceramic type, are capable of generating a large amount of force. However, they are only capable of generating a small displacement when a large voltage is applied. In the case of piezoelectric ceramics, this displacement can be a maximum of 0.1% of the length of the material. Thus, piezoelectric materials have been used as valve actuators and positional controls for applications requiring small displacements.

Two methods of generating more displacement per unit of applied voltage include bimorph assemblies and stack assemblies. Bimorph assemblies have two piezoelectric ceramic materials bonded together and constrained by a rim at their edges, such that when a voltage is applied, one of the piezoelectric material expands. The resulting stress causes the materials to form a dome. The displacement at the center of the dome is larger than the shrinkage or -expansion of the individual materials. However, constraining the rim of the bimorph assembly decreases the amount of available displacement. Moreover, the force generated by a bimorph assembly is significantly lower than the force that is generated by the shrinkage or expansion of the individual materials.

Stack assemblies contain multiple layers of piezoelectric materials interlaced with electrodes that are connected together. A voltage across the electrodes causes the stack to expand or contract. The displacements of the stack are equal to the sum of the displacements of the individual materials. Thus, to achieve reasonable displacement distances, a very high voltage or many layers are required. However, conventional stack actuators lose positional control due to the thermal expansion of the piezoelectric material and the material(s) on which the stack is mounted.

Due to the high strength, or stiffness, of piezoelectric material, it is capable of opening and closing against high forces, such as the force generated by a high pressure acting on a large surface area. Thus, the high strength of the piezoelectric material allows for the use of a large valve opening, which reduces the displacement or actuation necessary to open or close the valve.

With a conventional piezoelectrically actuated relay, the relay is "closed" by moving a mechanical part so that two electrode components come into electrical contact. The relay is "opened" by moving the mechanical part so that the electrode components are no longer in electrical contact. The electrical switching point corresponds to the contact between the electrode components of the solid electrodes.

Conventional piezoelectrically actuated relays typically do not possess latching capabilities. Where latching mechanisms do exist in piezoelectrically actuated relays, they make use of residual charges in the piezoelectric material to latch, or they actuate switch contacts that contain a latching mechanism. Prior methods and techniques of latching piezoelectrically actuated relays lacks reliability.

SUMMARY

The present invention is directed to a microelectromechanical system (MEMS) actuator assembly. Moreover, the present invention is directed to a piezoelectrically actuated relay that switches and latches.

In accordance with the invention, a piezoelectrically actuated relay that switches and latches by means of a liquid metal is disclosed. The relay operates by means of a longitudinal displacement of a piezoelectric element in extension mode displacing a solid slug imbedded within a liquid metal drop and causing the liquid metal to wet between at least one contact pad on the piezoelectric element or substrate and at least one other fixed pad to close the switch contact. The same motion that causes the solid slug imbedded within the liquid metal drop to change position can cause the electrical connection to be broken between the fixed pad and a contact pad on the piezoelectric element or substrate close to it. This motion of the piezoelectric element is rapid and causes the imparted momentum of the solid slug imbedded within the liquid metal drop to overcome the surface tension forces that would hold the bulk of the liquid metal drop in contact with the contact pad or pads near the actuating piezoelectric element. The switch latches by means of surface tension and the liquid metal wetting to the contact pads.

The switch can be made using micromachining techniques for small size. Also, the switching time is relatively short because piezoelectrically driven inkjet printheads have firing frequencies of several kHz and the fluid dynamics are much simplified in a switch application. Heat generation is also reduced compared with other MEMS relays that use liquid metal because only the piezoelectric elements and the passage of control and electric currents through the actuators of the switch generate any heat. The piezoelectric elements are capacitive in nature, so little power is dissipated in switching.

DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION OF THE INVENTION

Figure 1:
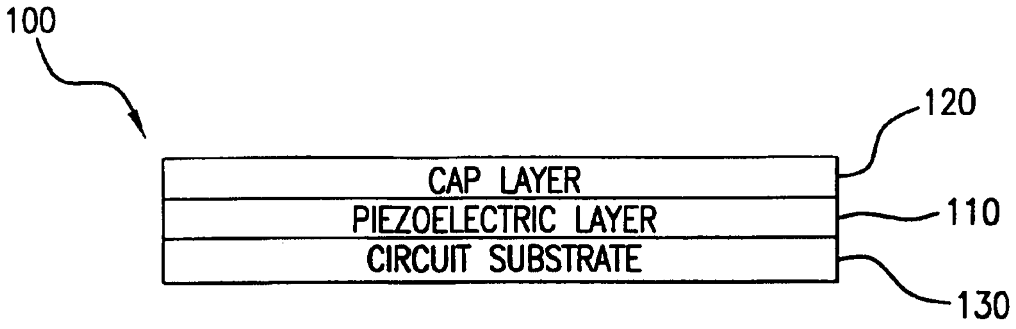
FIG. 1 is a side view showing three layers of a relay in accordance with the invention.

FIG. 1 is a side view of an embodiment of the invention showing three layers of a relay 100. The middle layer 110 is the piezoelectric layer and comprises the switching mechanism (not shown) of the relay 100. The top layer 120 provides a cap for the switching mechanism of the relay 100 and provides a barrier for the switching mechanism of the relay 100. The cap layer 120 prevents exposure of the switching mechanism. Below the piezoelectric layer 110 is a substrate layer 130. The substrate layer 130 acts as a base and provides a common foundation for a plurality of circuit elements that may be present.

Figure 2:
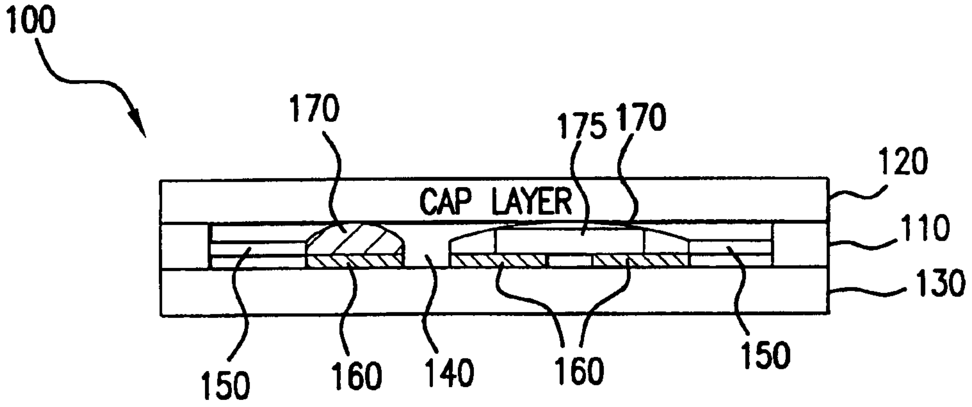
FIG. 2 is a cross sectional side view of a relay in accordance with the invention.

FIG. 2 shows a cross sectional view of an embodiment of a relay 100 in accordance with the invention. The top layer 120 and the substrate layer 130 are not altered in cross sectional views. The top layer 120 and the substrate layer 130 form solid layers that provide barriers and/or a medium for connection with other electronic components. The piezoelectric layer 110 has a chamber 140 that houses the switching mechanism for the relay 100. The switching mechanism comprises a pair of piezoelectric elements 150, a plurality of switch contacts 160 and a moveable liquid 170. A solid slug 175 is within the larger portion of the liquid metal 170. The solid slug is the primary moving portion of the switch.

The moveable liquid is electrically conductive and has physical characteristics that cause it to wet to the switch contacts 160. In a preferred embodiment of the invention, the moveable liquid 170 is a liquid metal capable of wetting to the switch contacts 160. In a most preferred embodiment of the invention, the liquid metal is mercury.

In operation, the switching mechanism operates by longitudinal displacement of the piezoelectric elements 150. An electric charge is applied to the piezoelectric elements 150 which causes the elements 150 to extend. Extension of one of the piezoelectric elements 150 displaces the solid slug 175 and the moveable liquid drop 170. The extension of the piezoelectric elements 150 is quick and forceful causing a ping-pong effect on the solid slug 175 and the liquid 170. The liquid 170 wets to the contact pads 160 causing a latching effect. When the electric charge is removed from the piezoelectric elements 150, the solid slug 175 and the liquid 170 do not return to their original position but remain wetted to the contact pad 160. In FIG. 2 the piezoelectric element 150 on the left has been electrically charged causing extension and has physically shocked the solid slug 175 and the liquid 170 causing a portion of it to ping-pong to the right where it combines with the liquid 170 which is wetted to the far right contact pad 160. As stated, the extension motion of the piezoelectric elements 150 is rapid and causes the imparted momentum of the solid slug 175 and the liquid drop 170 to overcome the surface tension forces that hold the solid slug 175 and the bulk of the liquid drop 170 in contact with the contact pad. The switching mechanism latches by means of the surface tension and the liquid 170 wetting to the contact pads. The solid slug 175 provides an advantage over using just a wettable conductive liquid. Imparting momentum to the solid slug 175 is more efficient than imparting momentum to just a wettable conductive liquid.

It is understood by those skilled in the art that the longitudinally displaceable piezoelectric elements shown in the figures is exemplary only. It is understood that a variety of piezoelectric modes exist which can be used while implementing the invention. For example, a bending mode piezoelectric element or a shear mode piezoelectric element can be used. It is further understood that the latching mechanism involved in the invention is independent of the means of imparting movement to the liquid. Any means capable of imparting sufficient force to cause the ping-pong effect suffices for purposes of this invention.

Figure 3:
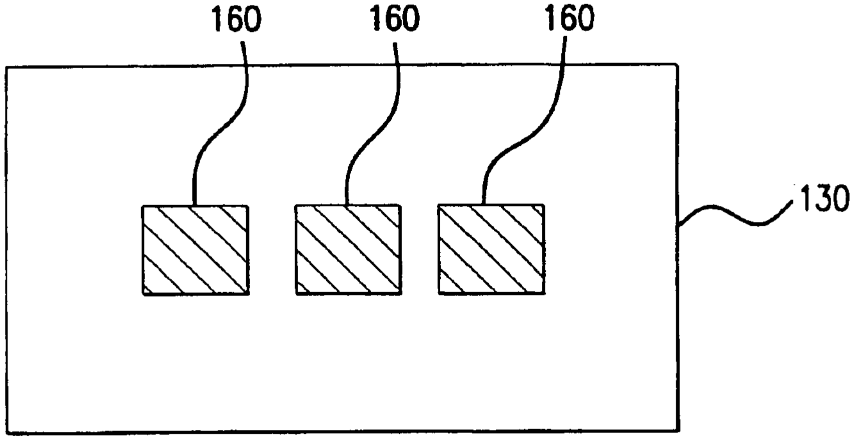
FIG. 3 is a top view of a circuit substrate and switch contacts in accordance with the invention.

FIG. 3 shows a top level view of the substrate layer 130 with the switch contacts 160. The switch contacts 160 can be connected through the substrate 130 to solder balls on the opposite side as shown in FIG. 3 for the routing of signals. Alternatively, circuit traces and contact pads can be provided on the shown side of FIG. 3.

Figure 4:
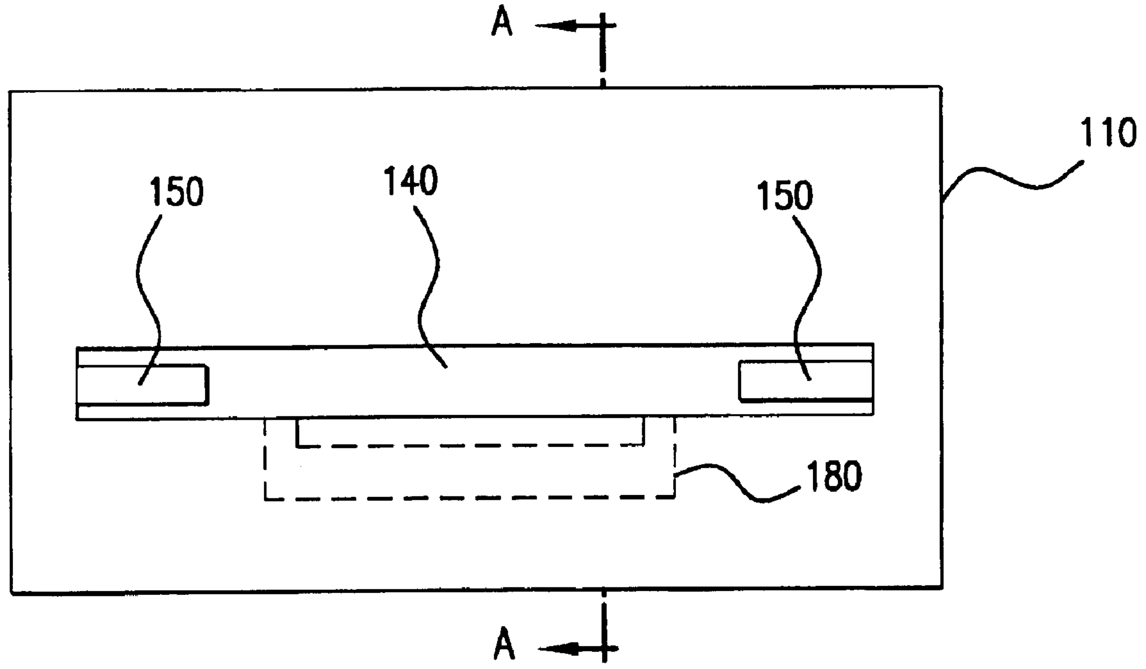
FIG. 4 is a top view of a piezoelectric layer of a relay in accordance with the invention.

FIG. 4 is a top view of a piezoelectric layer of a relay 100 showing the piezoelectric elements 150 and the chamber 140. FIG. 4 also shows a preferred embodiment of the invention wherein a vent passage 180 couples the space between the contact pads 160. Circuit traces for the piezoelectric elements 150 and the moveable liquid 170 are not shown. The vent passage 180 allows venting of the chamber 140 when the moveable liquid 170 is shocked from one side of the chamber 140 to the other. Venting of air allows unimpeded movement of the solid slug 175 and the moveable liquid 170. The venting passage 180 coincides with the chamber 140 at points which would be between the contact pads 160 of FIG. 3.

Figure 5:
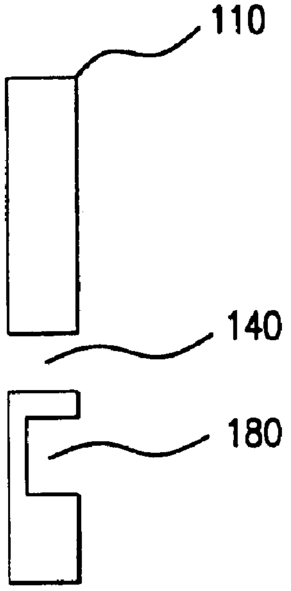
FIG. 5 is a cross sectional perspective of a piezoelectric layer of a relay in accordance with the invention.

FIG. 5 shows a cross sectional perspective of a piezoelectric layer of a relay at point A—A of FIG. 4. In this embodiment the venting passage 180 does not extend entirely through the entire thickness of the piezoelectric layer 110. It is understood by those skilled in the art that the venting passage 180 can extend entirely through the thickness of the piezoelectric layer 110 or it can extend only partially from either side. The circuit traces for the piezoelectric elements 150 are not shown in FIG. 5.

Figure 6:
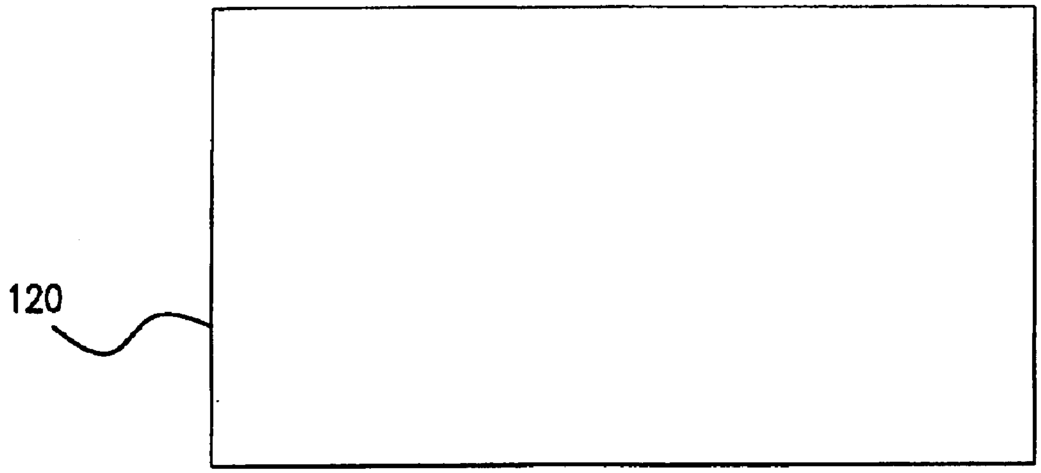
FIG. 6 is a top view of a cap layer of a relay in accordance with the invention.

FIG. 6 shows a top view of the cap layer 120. The cap layer is a solid sheet of material. The cap layer 120 acts to overlie the relay 100 forming the top of the chamber 140.

Figure 7:
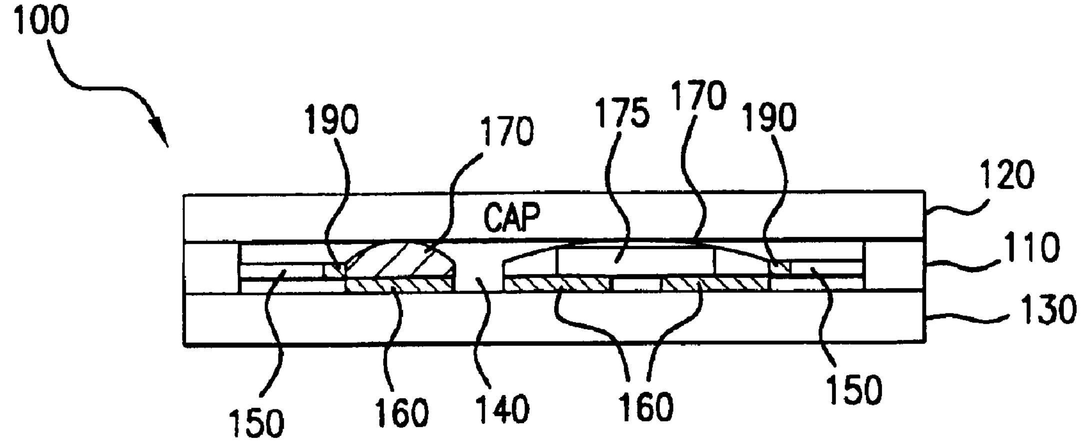
FIG. 7 is an alternative cross sectional side view of a relay in accordance with the invention.

FIG. 7 shows an alternate embodiment of the relay 100 of the invention. In operation, the switching mechanism operates by longitudinal displacement of the piezoelectric elements 150. An electric charge is applied to the piezoelectric elements 150 which causes the elements 150 to extend. Extension of one of the piezoelectric elements 150 displaces the solid slug 175 and the moveable liquid drop 170. The extension of the piezoelectric elements 150 is quick and forceful causing a ping-pong effect on the solid slug 175 and the liquid 170. The liquid 170 wets to the contact pads 160 causing a latching effect. Each of the piezoelectric elements 150 have a pad 190 fixed to the end to cause an additional wetting force. This additional pad 190 provides increased surface tension for the moveable liquid 170 so that a portion of the liquid 170 remains on the side contact pads 190. The pads 190 may also provide the means of electrically contacting the liquid metal at the ends of the channels. The interconnect traces are not shown. Also not shown in FIG. 7 is a venting passage that passes air between the contact pads 160 in the chamber 140.

When the electric charge is removed from the piezoelectric elements 150, the solid slug 175 and the liquid 170 does not return to its original position but remains wetted to the contact pad 160. In FIG. 2 the piezoelectric elements 150 on the left has been electrically charged causing extension and has physically shocked the solid slug 175 and the liquid 170 causing a portion of the liquid 170 to ping-pong to the right where it combines with the liquid 170 which is wetted to the far right contact pad 160. As stated, the extension motion of the piezoelectric elements 150 is rapid and causes the imparted momentum of the solid slug 175 and the liquid drop 170 to overcome the surface tension forces that hold the solid slug 175 and the bulk of the liquid drop 170 in contact with the contact pad. The switching mechanism latches by means of the surface tension and the liquid 170 wetting to the contact pads.

While only specific embodiments of the present invention have been described above, it will occur to a person skilled in the art that various modifications can be made within the scope of the appended claims.

What is claimed is:

1. A latching piezoelectric relay comprising:

a chamber;

a first, second and third contact pad equally separated from each other, each of said contact pads having at least a portion within the chamber;

a first and a second piezoelectric element disposed in opposition to each other within the chamber;

a moveable conductive liquid within the chamber, a first portion of the liquid is wetted to the first of said of contact pads and a portion of the liquid wetted to both the second and third of said contact pads; and a solid slug imbedded with said portion of the liquid wetted to both the second and the third of said contact pads;

wherein said solid slug and said portion of the liquid wetted to said second and third of said contact pads is moveable toward said portion wetted to the first of said contact pads.

2. The relay of claim 1, further comprising a layer of cap material above said chamber and a layer of substrate material below said chamber, wherein said first, second and third contact pads have at least a portion within the chamber.

3. The relay of claim 2, wherein said moveable conductive liquid is a liquid metal.

4. The relay of claim 3, wherein said liquid metal is mercury.

5. The relay of claim 3 wherein said liquid metal is an alloy that contains gallium.

6. The relay of claim 4, wherein said first and second piezoelectric elements are longitudinally displaceable.

7. The relay of claim 4, wherein said first and second piezoelectric elements are bending mode elements.

8. The relay of claim 4, wherein said first and second piezoelectric elements are shear mode elements.

9. A piezoelectric relay for latching, said relay comprising;

a cap layer, a piezoelectric layer positioned below said cap layer, and a substrate layer below said piezoelectric layer;

said piezoelectric layer comprising a chamber;

a first, second and third contact pad equally separated from each other, each of said contact pads having at least a portion within the chamber;

a first and a second piezoelectric element disposed in opposition to each other within the chamber;

a moveable conductive liquid within the chamber, a first portion of the liquid is wetted to the first of said of contact pads and a second portion of the liquid is wetted to both the second and third of said contact pads; and a solid slug imbedded with said portion of the liquid wetted to both the second and the third of said contact pads;

wherein said solid slug and said portion of the liquid wetted to said second and third of said contact pads is moveable toward said portion wetted to the first of said contact pads.

10. The relay of claim 9, wherein said moveable conductive liquid is a liquid metal.

11. The relay of claim 10, wherein said liquid metal is mercury.

12. The relay of claim 10, wherein said liquid metal is an alloy that contains gallium.

13. The relay of claim 11, wherein said first and second piezoelectric elements are longitudinally displaceable.

14. The relay of claim 11, wherein said first and second piezoelectric elements are bending mode elements.

15. The relay of claim 11, wherein said first and second piezoelectric elements are shear made elements.

* * * * *

UNITED STATES PATENT AND TRADEMARK OFFICE
CERTIFICATE OF CORRECTION

PATENT NO. : 6,927,529 B2

DATED : August 9, 2005

INVENTOR(S) : Fong et al.

It is certified that error appears in the above-identified patent and that said Letters Patent is hereby corrected as shown below:

Title page,
Item [56], References Cited, U.S. PATENT DOCUMENTS, delete “Bausman” and insert -- Beusman --, therefor.

Column 6,
Line 43, delete “made” insert -- mode --, therefor.

Signed and Sealed this

Twenty-second Day of November, 2005

JON W. DUDAS

*Director of the United States Patent and Trademark Office*